(12) United States Patent
Sakamoto

(10) Patent No.: US 8,598,644 B2
(45) Date of Patent: Dec. 3, 2013

(54) NONVOLATILE SEMICONDUCTOR STORAGE DEVICE AND METHOD OF MANUFACTURING THE SAME

(75) Inventor: Wataru Sakamoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/589,517

(22) Filed: Aug. 20, 2012

(65) Prior Publication Data

US 2013/0207175 A1 Aug. 15, 2013

(30) Foreign Application Priority Data

Aug. 23, 2011 (JP) ................................ 2011-181572

(51) Int. Cl.
*H01L 27/108* (2006.01)

(52) U.S. Cl.
USPC ............ 257/298; 257/E21.662; 257/E21.209; 257/E21.679

(58) Field of Classification Search
USPC .................. 257/298, 300, E21.209, E21.662, 257/E21.679
See application file for complete search history.

(56) References Cited

U.S. PATENT DOCUMENTS

2007/0296021 A1* 12/2007 Sugiyama et al. ............ 257/316
2012/0126306 A1 5/2012 Kawaguchi et al.

FOREIGN PATENT DOCUMENTS

JP 2010-40753 2/2010

* cited by examiner

*Primary Examiner* — Bilkis Jahan
(74) *Attorney, Agent, or Firm* — Oblon, Spivak, McClelland, Maier & Neustadt, L.L.P.

(57) ABSTRACT

A nonvolatile semiconductor storage device including a first transistor comprising a first gate electrode including a charge storage layer, an interelectrode insulating film, and a control electrode layer; a second transistor comprising a second gate electrode including a lower electrode, an upper electrode, and an upper silicide portion above the upper electrode; and a third transistor comprising a third gate electrode including a lower electrode, an upper electrode, and an upper silicide portion above the upper electrode; wherein the lower electrodes of the second and the third gate electrodes have a first side and a second side taken along a length direction of the second and the third gate electrodes, the lower electrodes of the second and the third gate electrodes including a lower silicide portion in which at least the first side of the lower electrodes are partially silicided.

20 Claims, 17 Drawing Sheets

NONVOLATILE SEMICONDUCTOR STORAGE DEVICE AND METHOD OF MANUFACTURING THE SAME

CROSS-REFERENCE TO RELATED APPLICATION(S)

This application is based upon and claims the benefit of priority from Japanese Patent Application No. 2011-181572, filed on, Aug. 23, 2011 the entire contents of which are incorporated herein by reference.

FIELD

Embodiments disclosed herein generally relate to a nonvolatile semiconductor storage device and a method of manufacturing the same.

BACKGROUND

Microfabrication of nonvolatile semiconductor storage devices such as a NAND flash memory have advanced to a level of employing new methodologies in providing insulation between the memory cells. Application of an air gap is being considered to replace insulation schemes in which the spaces between the memory cells are filled with dielectrics such as an oxide film. Because nothing is filled within an air gap, electric coupling between the neighboring memory cells can be minimized to improve the insulation properties of the memory cell region.

The air gap insulation scheme indeed improves the electric isolation between the memory cells. However, the gate electrodes of peripheral circuit transistors formed in the peripheral circuit region and select transistors formed in the memory cell region, typically comprising a polycrystalline silicon film, exhibits relatively higher resistance compared to the silicide portion located at the upper portion of the gate electrodes, which is one of the improvements that need to be made. Further, especially in the select transistors with scaled channel length, heavy dope of impurities, typically boron, being implanted in the channel region for increasing the threshold voltage causes an increase in the resistance in the region located between the NAND strings where contact is established with the bit lines.

BRIEF DESCRIPTION OF THE DRAWINGS

FIGS. 4A to 16A are schematic vertical cross sectional views taken along line 3A-3A of FIG. 2A and each depicts one phase of the manufacturing process flow.

FIGS. 4B to 16B are schematic vertical cross sectional views taken along line 3B-3B of FIG. 2B and each depicts one phase of the manufacturing process flow.

DESCRIPTION

Figure 1:
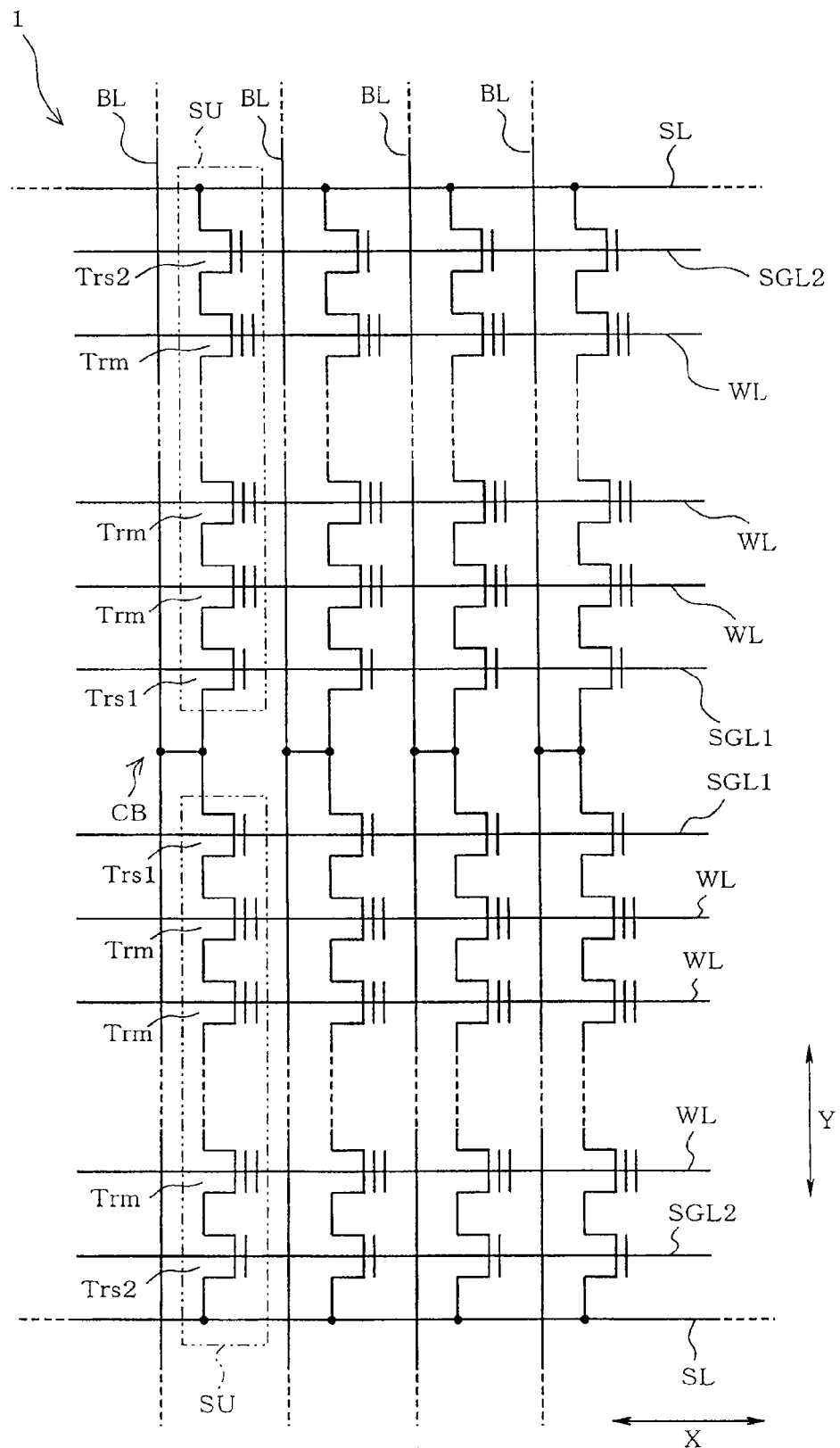
FIG. 1 is a partial equivalent circuit representation of a semiconductor storage device of a first embodiment.

In one embodiment a nonvolatile semiconductor storage device comprises a semiconductor substrate including a first region and a second region; a gate insulating film formed in the first region and the second region; a first transistor formed above the gate insulating film in the first region and comprising a first gate electrode including a charge storage layer, an interelectrode insulating film, and a control electrode layer, the first gate electrode being isolated from one another; a second transistor formed above the gate insulating film in the first region so as to be located adjacent to the first transistor, the second transistor comprising a second gate electrode including a lower electrode, an upper electrode, and an upper silicide portion above the upper electrode; and a third transistor formed above the gate insulating film in the second region and comprising a third gate electrode including a lower electrode, an upper electrode, and an upper silicide portion above the upper electrode; wherein the lower electrodes of the second and the third gate electrodes have a first side and a second side taken along a length direction of the second and the third gate electrodes, the lower electrodes of the second and the third gate electrodes including a lower silicide portion in which at least the first side of the lower electrodes are partially silicided.

In one embodiment a method of manufacturing a nonvolatile semiconductor storage device comprises forming a gate insulating film above a semiconductor substrate; forming, above the gate insulating film, a first film comprising a polycrystalline silicon film or an amorphous silicon film, an interelectrode insulating film, and a second film comprising a polycrystalline silicon film or an amorphous silicon film; patterning the second film, the interelectrode insulating film, and the first film into: a plurality of first gate electrodes of a memory cell transistor, a plurality of second gate electrodes, having a first side and a second side, of a select transistor, the first side of the second gate electrode opposing the first side of the adjacent second gate electrode, and a plurality of third gate electrodes, having a first side and a second side, of a peripheral circuit transistor, so that the first side of the first film of the second gate electrode as well as the first and the second sides of the first film of the third gate electrode include a stepped portion that protrudes with respect to the second film; forming an oxide film above the first, second, and the third gate electrodes; exposing an upper portion of the second film and a portion of the stepped portion of the first film; forming a lower silicide portion by siliciding the stepped portion of the first film as well as forming an upper silicide portion by siliciding the upper portion of the second film; and forming, after the silicidation, an insulating film across the upper surfaces of isolated structures of the first gate electrodes.

Embodiments are described hereinafter with references to the accompanying drawings to provide illustrations of the features of the embodiments. Elements that are identical or similar are represented by identical or similar reference symbols across the figures and are not redescribed. The drawings are not drawn to scale and thus, do not reflect the actual measurements of the features such as the correlation of thickness to planar dimensions and the relative thickness of different layers. Further, directional terms such as up, upper, upward, down, lower, downward, left, leftward, right, and rightward are used in a relative context with an assumption that the worked surface of the later described semiconductor substrate faces up. Thus, the directional terms do not necessarily correspond to the directions based on gravitational acceleration.

With reference to FIGS. 1 to 16B, a description will be given hereinafter on a first embodiment of a nonvolatile semiconductor storage device through a NAND flash memory device application.

First, a description is given on the structure of NAND flash memory of the first embodiment. FIG. 1 is a partial equivalent circuit representation of a memory cell array formed in a memory cell region of NAND flash memory 1. The memory cell array is a collection of units of NAND cells also referred to as NAND cell unit SU or NAND string arranged in rows and columns. NAND cell unit SU comprises a multiplicity of series connected memory cell transistors Trm, such as 64 in number, situated between a couple of select transistors Trs1 and Trs2 that are located at Y-direction ends of NAND cell unit SU. The neighboring memory cell transistors Trm within NAND cell unit SU share their source/drain regions. Memory cell transistor Trm is also referred to as a first transistor and select transistor Trs1/Trs2 is also referred to as a second transistor.

The X-direction aligned memory cell transistors Trm shown in FIG. 1 are interconnected by common word line WL extending in the X direction, whereas the X-direction aligned select transistors Trs1 are interconnected by common select gate line SGL1 extending in the X direction and likewise, the X-direction aligned select transistors Trs2 are interconnected by common select gate line SGL2 also extending in the X direction. Select gate electrode SGD also referred to as a second gate electrode is formed at the intersection of select gate line SGL1 and a later described device region Sa. Similarly, select gate electrode not shown is formed at intersection of select gate line SGL2 and the later described device region Sa.

Figure 2A:
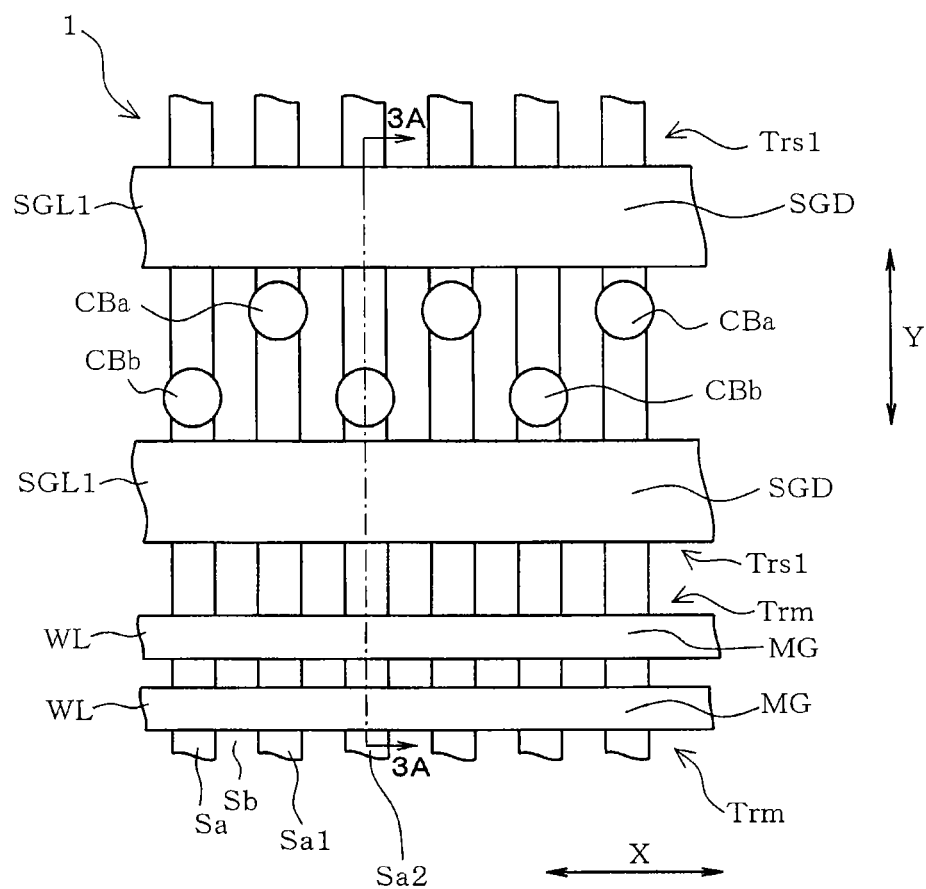
FIG. 2A is a schematic plan view partially illustrating the structure of a memory cell region.

The drain of each select transistor Trs1 is coupled to bit line BL by way of bit line contact CB represented as CBa and CBb in FIG. 2A. Bit line BL extends in the Y direction orthogonal to the X direction shown in FIG. 1. The source of select transistor Trs2 is coupled to source line SL extending in the X-direction.

FIG. 2A provides a planar layout of the memory cell region in part. As shown, multiplicity of isolation regions Sb run in the Y direction as viewed in FIG. 2A of silicon substrate 2, or more generally, silicon substrate 2. Isolation regions Sb are separated from one another in the X direction as viewed in FIG. 2A to isolate element regions Sa, running in the Y-direction, by a predetermined space interval in the X direction. The isolation typically employs a shallow trench isolation scheme in which the trenches are filled with an insulating film.

Figure 3A:
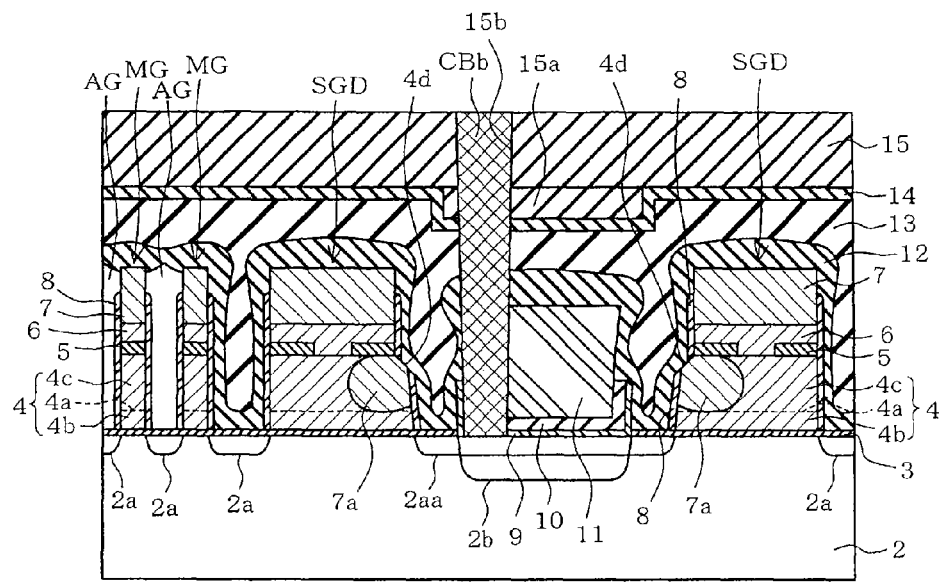
FIG. 3A is schematic vertical cross sectional view taken along line 3A-3A of FIG. 2A.

Multiplicity of word lines WL, spaced from one another in the Y direction by a predetermined spacing, extend in the X direction as viewed in FIG. 2A which is the direction orthogonal to the Y direction in which element region Sa extends. Above element region Sa intersecting with word line WL, gate electrode MG of memory cell transistor Trm shown in FIG. 3A is formed. Gate electrode MG is also referred to as a first gate electrode.

Bit line contacts CBa and CBb are formed alternately one by one in each element region Sa so as to be located between Y-directionally opposing select transistors Trs1.

As can be seen in FIG. 2A, bit line contact CBa formed in first element region Sa1 is disposed Y-directionally proximal to the upper select gate line SGL1 or select gate electrode SGD. Bit line contact CBb, on the other hand, formed in second element region Sa2 is disposed Y-directionally proximal to the lower select gate line SGL1 or select gate electrode SGD.

Thus, bit line contacts CBa and CBb are disposed so as to be Y-directionally shifted from one another in the adjacent element regions Sa to exhibit a zigzag layout as can be seen in FIG. 2A. Because of such zigzag layout, spacing between bit line contacts CBa and CBb can be relatively increased to reduce the risk of shorting between bit line contacts CBa and CBb. Though not shown, a source line contact is formed in element region Sa located between the two opposing pair of select gate lines SGL2.

Figure 2B:
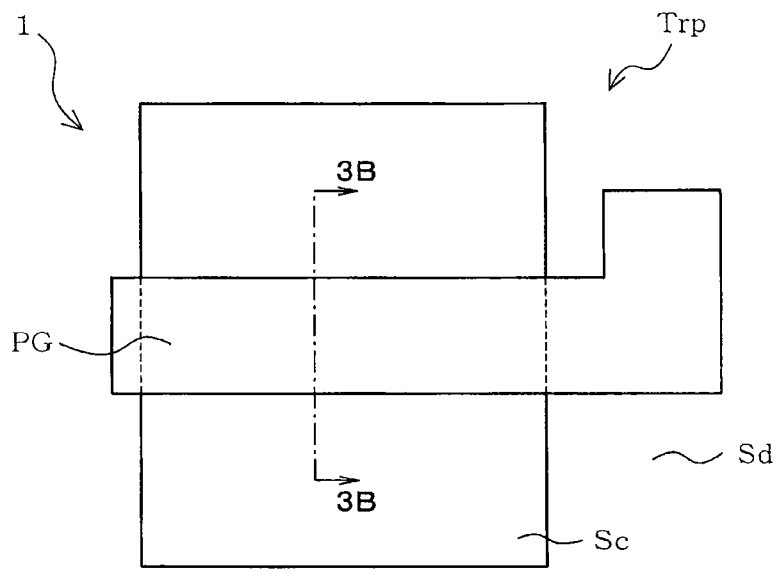
FIG. 2B is a plan view of a peripheral circuit transistor.

FIG. 2B is a plan view of peripheral circuit transistor Trp also referred to as a third transistor provided in the peripheral circuit region of silicon substrate 2. As shown in FIG. 2B, the peripheral circuit region has a plurality of rectangular element regions Sc which are each surrounded by element isolation region Sd employing an STI scheme. Above element region Sc, gate electrode PG also referred to as a third gate electrode is formed so as to transverse the element region Sc and further extend across the element isolation region Sd. One end of gate electrode PG is patterned into an L-shape to form a contact region.

Figure 3B:
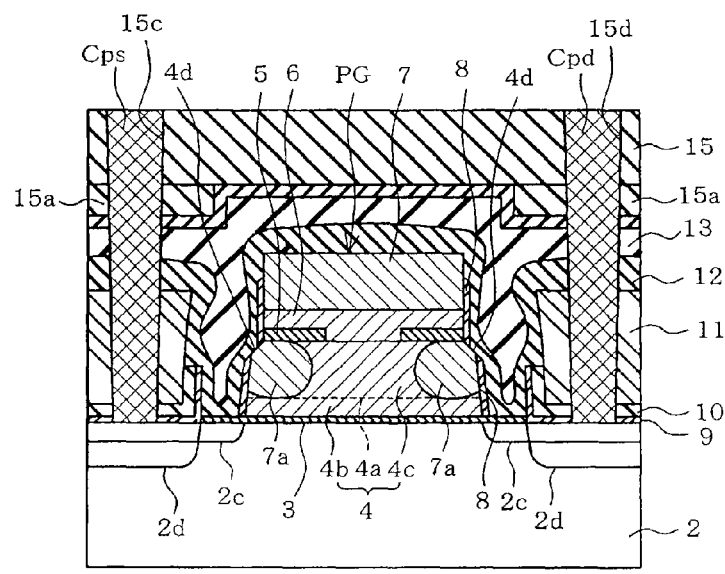
FIG. 3B is schematic vertical cross sectional view taken along line 3B-3B of FIG. 2B.

FIG. 3A is a schematic cross sectional view taken along line 3A-3A of FIG. 2A, whereas FIG. 3B is a schematic cross sectional view taken along line 3B-3B of FIG. 2B. FIG. 3A is a Y-directional cross section of a pair of select transistors Trs1 located at the ends of opposing NAND strings provided in the memory cell region and bit line contact CBb interposing select transistors Trs1. Though not shown, the Y-directional cross section of bit line contact CBa is substantially identical to FIG. 3A. FIG. 3B shows a cross section of gate electrode PG of peripheral circuit transistor Trp. Transistor Trp is a representative example of various types of transistors provided in the peripheral circuit region.

Referring to FIG. 3A, gate insulating film 3 is formed above silicon substrate 2. Gate insulating film 3 typically comprises a silicon oxide film and is formed above the upper surface of silicon substrate 2 in the regions where memory cell transistors Trm and select transistors Trs 1 are formed. In the first embodiment, memory cell transistor Trm comprises gate electrode MG formed above gate insulating film 3 and source/drain region 2a.

Gate electrode MG of memory cell transistor Trm includes floating gate electrode FG, interelectrode insulating film 5, and control gate electrode CG stacked in the listed sequence above gate insulating film 3. Floating gate electrode FG serves as a charge storage layer and comprises a polycrystalline silicon film 4 also referred to as a first film. Polycrystalline silicon film 4 comprises a stack of lower polycrystalline silicon layer 4b, isolation layer 4a, and upper polycrystalline silicon layer 4c. Isolation layer 4a in the middle of the stack is oxygen rich. Interelectrode insulating film 5 resides between floating gate electrode FG and control gate electrode CG. Interelectrode insulating film 5 typically takes an ONO structure comprising a stack of oxide/nitride/oxide films, which may be provided with additional bottom and top nitrides to take a NONON structure and may also comprise a high dielectric constant insulating film. Control gate electrode CG comprises polycrystalline silicon film 6 also referred to as a second film and includes a silicide portion 7 also referred to as an upper silicide portion.

In the surface layer of silicon substrate 2 located between gate electrodes MG and between gate electrodes SGD and MG, source/drain region 2a is formed. In the surface layer of silicon substrate 2 located between gate electrodes SGD, LDD (lightly doped drain) drain region 2aa is formed which serves as a drain region. Though not shown, in the surface layer of silicon substrate 2 located between opposing gate electrodes of source side select gate transistors, LDD drain region is formed which serves as a source region. Source/drain region 2a and LDD region 2aa are formed by doping impurities into the surface layer of silicon substrate 2. Further in the surface layer of silicon substrate 2 located between gate electrodes SGD, drain region 2b heavily doped with impurities is formed to obtain an LDD structure.

Silicide portion 7 may be formed by depositing a silicide film on to polycrystalline silicon film 6 or may be obtained by forming a metal film such as nickel (Ni), cobalt (Co), titanium (Ti), platinum (Pt), palladium (Pd), tantalum (Ta), and molybdenum (Mo) on polycrystalline silicon film 6 and siliciding the upper portion of polycrystalline silicon film 6 through thermal treatment. The first embodiment employs a nickel silicide as a metal for silicidation.

As shown in FIG. 3A, a plurality of memory cell transistors Trm described above are aligned in the Y direction in NAND cell unit SU so as to interpose a pair of select transistors Trs 1 and Trs 2 though select transistor Trs2 is not shown. Select transistors Trs 1 are each provided with select gate electrode SGD which is substantially identical in structure to gate electrode MG of memory cell transistor Trm and thus, is configured by polycrystalline silicon film 4, interelectrode insulating film 5, polycrystalline silicon film 6, and silicide portion 7 in the listed sequence. Select gate electrode SGD differs from memory cell gate electrode MG in that a through hole penetrates the central portion of interelectrode insulating film 5 to defunctionalize interelectrode insulating film 5 by electrically conducting polycrystalline silicon films 4 and 6. Though not shown, the cross section of select transistor Trs2 is also similar in structure to select gate electrode SGD.

As mentioned earlier, polycrystalline silicon film 4 comprises a stack of lower polycrystalline silicon layer 4b, isolation layer 4a, and upper polycrystalline silicon layer 4c. The middle isolation layer 4a is oxygen rich and isolates upper polycrystalline silicon layer 4c from lower polycrystalline silicon layer 4b. As can be seen in FIG. 3A, one side of polycrystalline silicon film 4, also referred to as a first side, that opposes the adjacent select gate electrode SGD is stepped so as to protrude toward the adjacent select gate electrode SGD as compared to polycrystalline silicon film 6 located in the upper layer as represented by slope 4d exhibiting a inclined surface. The portion of upper polycrystalline silicon layer 4c located inward relative to the protruding slope 4d is silicided and is represented as silicide portion 7a also referred to as a lower silicide portion. As shown in FIG. 3A, silicide portion 7a is obtained by siliciding upper polycrystalline silicon layer 4c located on one length directional side i.e. Y directional side of gate electrode SGD. Silicide portion 7a extends downward until isolation layer 4a is reached, meaning that the silicidation is stopped at isolation layer 4a.

As described earlier and as can be seen in FIG. 3A, select gate electrode SGD of select transistor Trs1 and gate electrode MG of memory cell transistor Trm are aligned in the Y direction. Between the adjacent memory cell gate electrodes MG, silicon oxide film 8 serving as a protective film is lined so as to extend from the sidewall of one memory cell gate electrode MG to another. More specifically, sidewall of memory cell gate electrode MG is lined by oxide film 8 which runs down from the mid height of the sidewall of silicide portion 7, along the sidewalls of polycrystalline silicon film 6, interelectrode insulating film 5, and polycrystalline silicon film 4. Oxide film 8 further runs continuously along the upper surface of gate insulating film 3 above silicon substrate 2 situated between the memory cell gate electrodes MG to line the sidewall of the adjacent memory cell gate electrode MG.

Similarly, between the adjacent memory cell gate electrode MG and select gate electrode SGD, oxide film 8 is lined so as to extend from the sidewall of memory cell gate electrode MG to the sidewall of select gate electrode SGD and vice versa. More specifically, sidewall of memory cell gate electrode MG and select gate electrode SGD is lined by oxide film 8 which runs down from the mid height of the sidewall of silicide portion 7, along the sidewalls of polycrystalline silicon film 6, interelectrode insulating film 5, and polycrystalline silicon film 4. Oxide film 8 further runs continuously along the upper surface of gate insulating film 3 above silicon substrate 2 situated between the memory cell gate electrodes MG and select gate electrode SGD.

Between the adjacent select gate electrodes SGD, which may also be referred to as the bit line contact region in which bit line contacts CBa and CBb are formed, silicon oxide film 8 is lined along the sidewalls of the adjacent select gate electrodes SGD with the exception of the portion of upper polycrystalline silicon layer 4c located along slope 4d where silicide portion 7a is formed. As can be seen in FIG. 3A, silicon oxide film 8 is absent along slope 4d to partially expose silicide portion 7a.

Further between the adjacent select gate electrodes SGD, NSG (non-doped silicate glass) film 11 serving as an interlayer insulating film is filled in the region above the upper surface of silicon substrate 2 which is spaced by a predetermined distance from the sidewalls of the opposing gate electrodes SGD. As can be seen in FIG. 3A, a stack of silicon oxide film 9 and silicon nitride film 10 interposes silicon substrate 2 and NSG film 11. NSG film 11 is formed so as to increase its cross sectional area with elevation from the upper surface of silicon substrate 2. The upper surface of NSG film 11 is located substantially at mid height of silicide portion 7. The underside and a part of the sidewalls of NSG film 11 is covered by the stack of silicon oxide film 9 and silicon nitride film 10. Silicon nitride film 10 serves as a contact stopper. The distance between upper sidewall of NSG film 11 and the sidewall of gate electrode SGD is greater than the distance between the opposing sidewalls of the adjacent gate electrodes MG.

Above the upper surfaces of gate electrodes MG, silicon oxide film 12 is formed so as to enclose air gaps AG provided between gate electrodes MG so as to isolate gate electrodes MG. Thus, air gaps AG between gate electrodes MG remain unfilled to serve as insulating air gaps AG. Between gate electrodes MG and SGD, silicon oxide film 12 is formed so as to cover silicon oxide film 8 formed along the sidewalls of gate electrodes MG and SGD and above silicon substrate 2 located between gate electrodes MG and SGD. Between gate electrodes SGD, silicon oxide film 12 is formed along the sidewalls of gate electrodes SGD and along the upper surface and the sidewall of NSG film 11. Within the lower narrow gap located between gate electrode SGD and NSG film 11 silicon oxide film 12 is formed so as to fill the gap.

Above silicon oxide film 12, silicon oxide film 13 is further blanketed entirely above the memory cell region. As a result, the air gaps between gate electrodes MG and SGD and between gate electrodes SGD are filled with silicon oxide film 13 and the upper surface of silicon oxide film 13 is planarized. Above the upper surface of silicon oxide film 13, silicon nitride film 14 is blanketed entirely across the memory cell region which is further blanketed by silicon oxide film 15 typically comprising TEOS (Tetra Ethyl Ortho Silicate). Silicon nitride film 14 serves as a stopper film during the anisotropic etching (RIE: Reactive Ion Etching) performed when forming bit line contacts CBa and CBb. Similar structure comprising silicon oxide film 13 and silicon nitride film 14 is formed in the air gap between gate electrodes SGD as well.

Still referring to FIG. 3A, bit line contact CBb is formed through silicon oxide film 15, silicon nitride film 14, silicon oxide film 13, silicon oxide film 12, NSG film 11, silicon nitride film 10, and silicon oxide film 9 so as to be placed in contact with drain region 2b. Though not shown, bit line contact CBa is formed in a similar manner. Bit line contacts CBa and CBb comprise tungsten (W) contact plug and a barrier metal coating. As shown in FIG. 3A, bit line contact CBb is located relatively closer to the left side select gate electrode SGD whereas bit line contact CBa not shown is located relatively closer to the right side select gate electrode SGD.

Referring now to FIG. 3B, gate insulating film 3 comprising a silicon oxide film is formed above silicon substrate 2 located in element region Sc of the peripheral circuit region. Some of transistors Trp in the peripheral circuit region are designed as high level voltage transistors and thus, relatively thicker gate insulating film 3 is formed in a separate process for such transistors. Peripheral circuit transistor Trp comprises gate electrode PG formed above gate insulating film 3 and LDD region 2c. Each LDD region 2c includes source contact Cps and drain contact Cpd which are not shown in FIG. 2B.

Gate electrode PG of peripheral circuit transistor Trp includes a lower electrode, interelectrode insulating film 5, and an upper electrode stacked in the listed sequence above gate insulating film 3. Lower electrode comprises a polycrystalline silicon film 4 also referred to as a first film. Polycrystalline silicon film 4 comprises a stack of lower polycrystalline silicon layer 4b, isolation layer 4a, and upper polycrystalline silicon layer 4c as described earlier. Isolation layer 4a in the middle of the stack is oxygen rich. Interelectrode insulating film 5 residing between lower electrode and upper electrode has a through hole penetrating its central portion to defunctionalize interelectrode insulating film 5 by electrically conducting polycrystalline silicon films 4 and 6. Upper electrode comprises a polycrystalline silicon film 6 also referred to as a second film.

As shown in FIG. 3B, upper polycrystalline silicon layer 4c contains silicide portions 7a in the two Y-directional sides of upper polycrystalline silicon layer 4c. Silicide portions 7a are formed by a silicidation process that follows the formation of polycrystalline silicon film 4. Further, upper polycrystalline silicon layer 4c and lower polycrystalline silicon layer 4b are greater in width as compared to the overlying interelectrode insulating film 5 and is provided with slope 4d at their sidewalls. Slope 4d includes a short gradual slope in its upper section and a long steep slope in its lower section.

Sidewall of gate electrode PG of peripheral transistor Trp is lined by oxide film 8 which runs down from the mid height of the sidewall of silicide portion 7, along the sidewalls of polycrystalline silicon film 6, interelectrode insulating film 5, and polycrystalline silicon film 4 with the exception of the portion of upper polycrystalline silicon layer 4c located along slope 4d where silicide portion 7a is formed. As can be seen in FIG. 3B, silicon oxide film 8 is absent along slope 4d to partially expose silicide portion 7a.

As can be seen in FIG. 3B, on each Y-directional sides of gate electrode PG, NSG film 11 is formed so as to be spaced by a predetermined distance from each of the Y-directional sidewalls of gate electrode PG. As can be seen FIG. 3B, a stack of silicon oxide film 9 and silicon nitride film 10 interposes silicon substrate 2 and each of NSG films 11. NSG film 11 is formed so as to increase its cross sectional area with elevation from the upper surface of silicon substrate 2. The upper surface of NSG film 11 is located substantially at mid height of silicide portion 7. The underside and a portion of the sidewalls of NSG film 11 is covered by the stack of silicon oxide film 9 and silicon nitride film 11.

Above the upper surface and along the sidewall of gate electrode PG, silicon oxide film 12 is formed which further extends along the Y direction to run along the sidewall and the upper surface of NSG film 11 beside gate electrode PG as viewed in FIG. 3B. Within the lower narrow gap located between gate electrode PG and NSG film 11, silicon oxide film 12 is formed so as to fill the gap. Above silicon oxide film 12, silicon oxide film 13 is further blanketed entirely above element region Sc and the upper surface of silicon oxide film 13 is planarized. Above the upper surface of silicon oxide film 13, silicon nitride film 14 and silicon oxide film 15 are blanketed entirely across element region Sc.

As shown in FIG. 3B, heavily doped source/drain region 2d is formed within LDD region 2c below gate electrode PG. Source contact Cps and drain contact Cpd are formed through silicon oxide film 15, silicon nitride film 14, silicon oxide film 13, silicon oxide film 12, NSG film 11, silicon nitride film 10, and silicon oxide film 9 so as to be placed in contact with source/drain region 2b. Contacts Cps and Cpd comprise tungsten (W) contact plug and a barrier metal coating.

One example of a process flow for manufacturing the above described structure will be discussed with reference to FIGS. 4A to 16B. The following descriptions will focus on the features of the first embodiment and thus, known steps may be added or removed from the process flow as required. Further the sequence of the process flow may be rearranged if practicable.

Figure 4A:
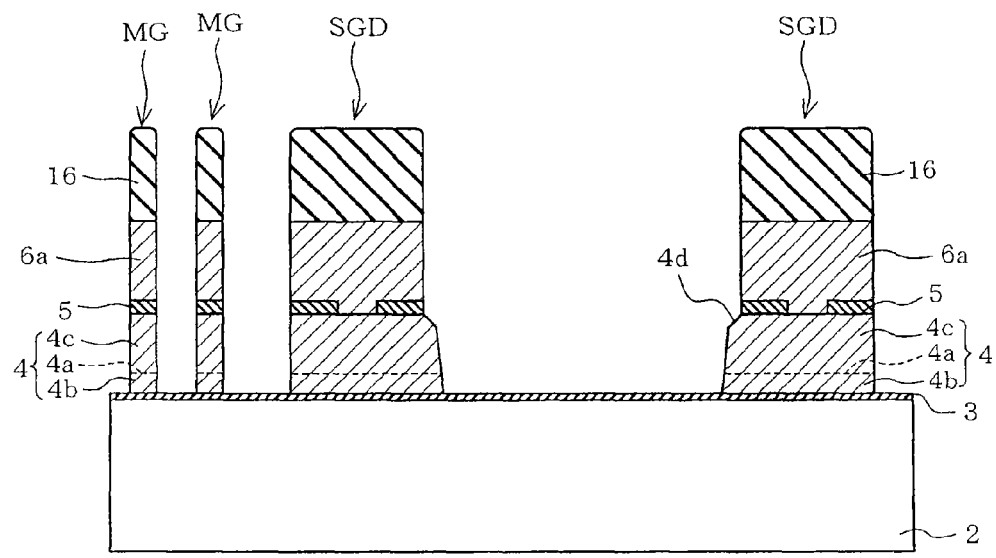
Figure 4B:
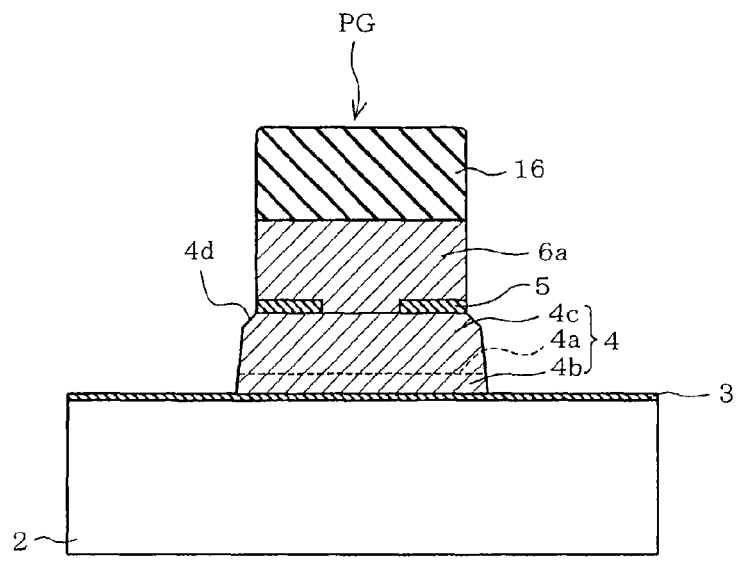

The description will begin with the process flow for obtaining the gate structures shown in FIGS. 4A and 4B. After preparing a p-type silicon substrate 2, gate insulating film 3 comprising a silicon oxide film is formed above silicon substrate 2 typically by thermal oxidation. Then, polycrystalline silicon film 4 also referred to as a first film and used for forming floating gate electrode FG is deposited by LPCVD (Low Pressure Chemical Vapor Deposition). Impurity doped to polycrystalline silicon film 4 may be n-type impurities such as phosphorous (P) or p-type impurities such as boron (B). Further, polycrystalline silicon film 4 is configured to contain nitride or carbon in the density ranging between 0.01 to 0.1 relative to silicon. During the formation of polycrystalline silicon film 4, a thin isolation layer 4a having rich oxygen content is formed to subdivide polycrystalline silicon film 4 into lower polycrystalline silicon layer 4b and upper polycrystalline silicon layer 4c. One exemplary method for forming isolation layer 4c includes forming lower polycrystalline silicon layer 4b with an ordinary recipe for forming a polycrystalline silicon film, and purging the reaction chamber with oxygen to expose lower polycrystalline silicon layer 4b to oxidizing atmosphere.

Next, though not shown, polycrystalline silicon film 4 and the upper portion of silicon substrate 2 are separated by photolithography and etching methods in the direction normal to the page of FIGS. 4A and 4B, in other words, the X direction. The gap created by the separation is thereafter filled with an element isolation insulating film not shown to form isolation regions Sb and Sd that separate element regions Sa and Sc into a multiplicity of strips.

Then, above polycrystalline silicon film 4, interelectrode insulating film 5 typically configured as an ONO stack is formed by LPCVD. Formation of ONO film may be preceded and followed by a radical nitridation to form a NONON stack.

Further, the middle nitride layer may be replaced by a layer of aluminum oxide (alumina) or hafnium oxide. Next, above interelectrode insulating film 5, polycrystalline silicon film 6a also referred to as the second film and used for forming control gate electrode CG is formed by CVD. Polycrystalline silicon film 6a is relatively thicker than polycrystalline silicon film 6 shown in FIGS. 3A and 3B and is inclusive of the thickness of silicide portion 7. Then, nitride cap 16 is formed above polycrystalline silicon film 6a by CVD.

Next, silicon oxide film not shown is formed above nitride cap 16 that serves as a hard mask in the subsequent dry etching, followed by forming and patterning of a photoresist not shown above the hard mask by photolithography. The photoresist is patterned into a line and space pattern in the memory cell region, whereas in the peripheral circuit region, the photoresist is patterned according to the circuitry design. Using the patterned photoresist as a mask, the hard mask is patterned, whereafter the patterned hard mask is used as a mask to anisotropically etch nitride cap 16, for instance, by RIE.

Then, by anisotropically etching polycrystalline silicon film 6a, interelectrode insulating film 5, and polycrystalline silicon film 4, the stacked gate structures of gate electrodes MG, SGD, and PG are isolated. Gate insulating film 3 located between the gate structures may be partially or completely etched as required if found to be appropriate to do so at this stage. The anisotropic etching carried out for forming relatively small aspect ratio features such as the gap between select gate electrodes SGD and the gaps in the periphery of gate electrode PG is carefully controlled such that a stepped section is formed at the lower portion of interelectrode insulating film 5, more specifically, at the boundary between interelectrode insulating film 5 and polycrystalline silicon film 4. As a result, slope 4d is formed on one Y-directional side of gate electrode SG also referred to as the first side which opposes the sidewall of the adjacent gate electrode SG, as well as on both Y-directional sides of gate electrode PG also referred to as the first side and the second side so as to extend down along upper polycrystalline silicon layer 4c and lower polycrystalline silicon layer 4b. The structures shown in FIGS. 4A and 4B are obtained by the above described process flow.

Figure 5A:
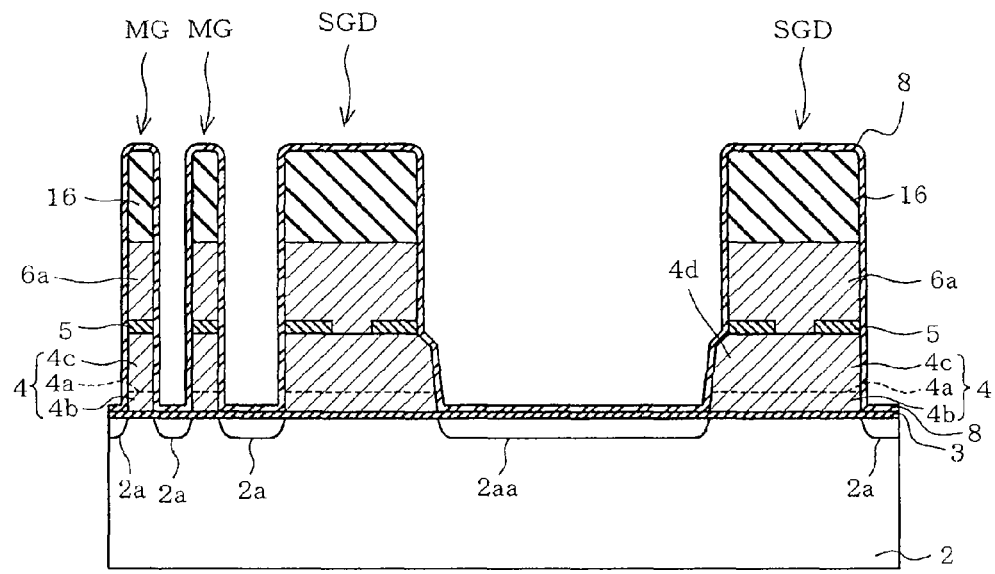
Figure 5B:
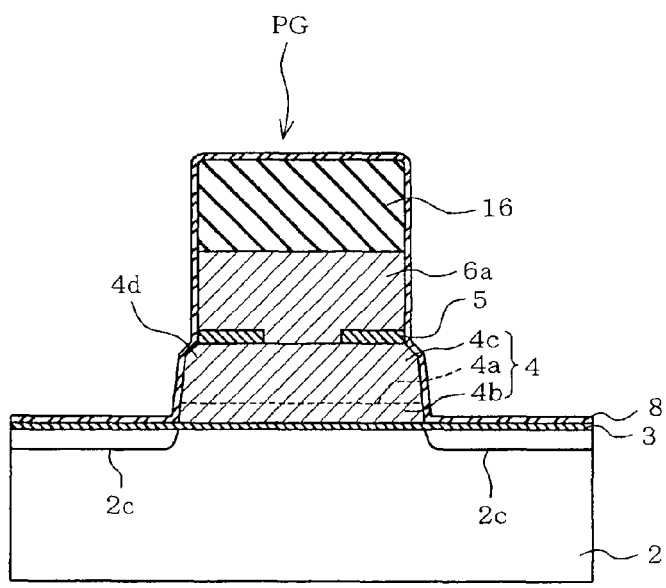

Referring now to FIGS. 5A and 5B, silicon oxide film 8 is formed by ALD (Atomic Layer Deposition). Silicon oxide film 8 is formed above gate insulating film 3, in other words, above silicon substrate 2, along the sidewall of polycrystalline silicon film 4, along the sidewall of interelectrode insulating film 5, along the sidewall of polycrystalline silicon film 6, and above the upper surface and along the sidewall of cap nitride cap 16.

Next, using the stacked gate structures of gate electrodes MG, SGD and PG as masks, ions such as phosphorus, in case of an n-type impurity, are implanted in a self-aligned manner into the surface layer of silicon substrate 2. Then, the implanted impurities are thermally treated to obtain source/drain region 2a, LDD 2aa and LDD 2c. Though not shown, LDD 2aa is formed the source region as well.

Figure 6A:
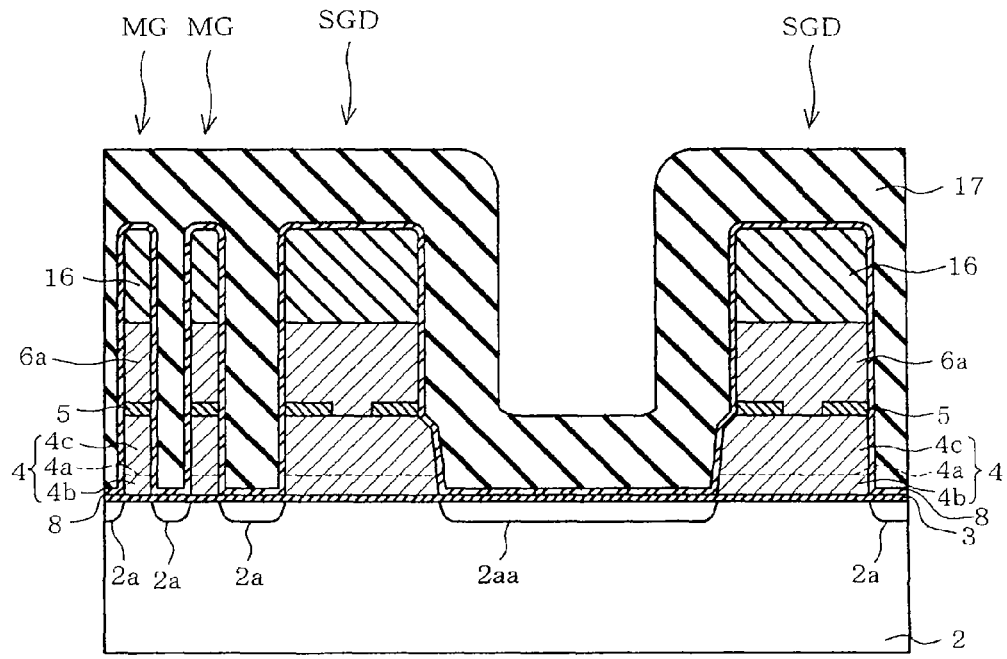
Figure 6B:
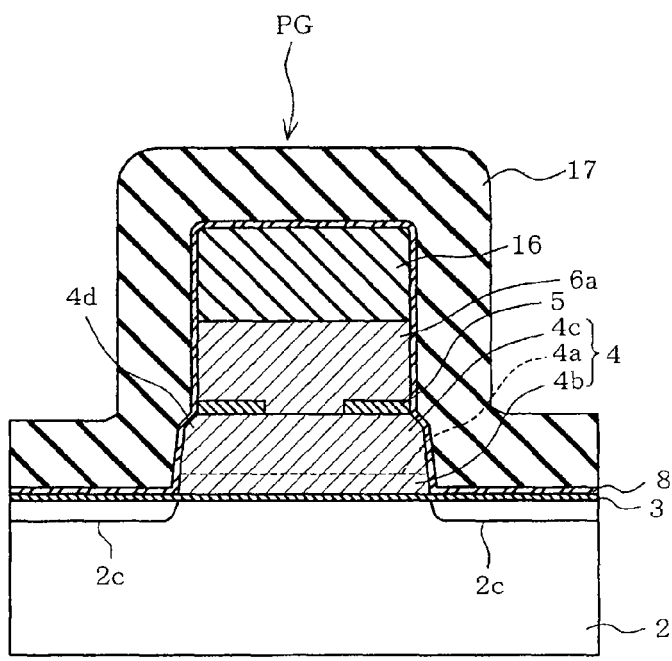

Thereafter, as shown in FIGS. 6A and 6B, silicon nitride film 17 is formed so as to cover gate electrodes MG, SG, and PG and fill the gaps between gate electrodes MG and SGD, and between gate electrodes MG. Silicon nitride film 17 serves as a sacrificial film when forming air gaps AG and is typically formed by ALD. Silicon nitride film 17 and silicon oxide film 8 discussed earlier are preferably formed by ALD, however, LPCVD may be employed as well.

Figure 7A:
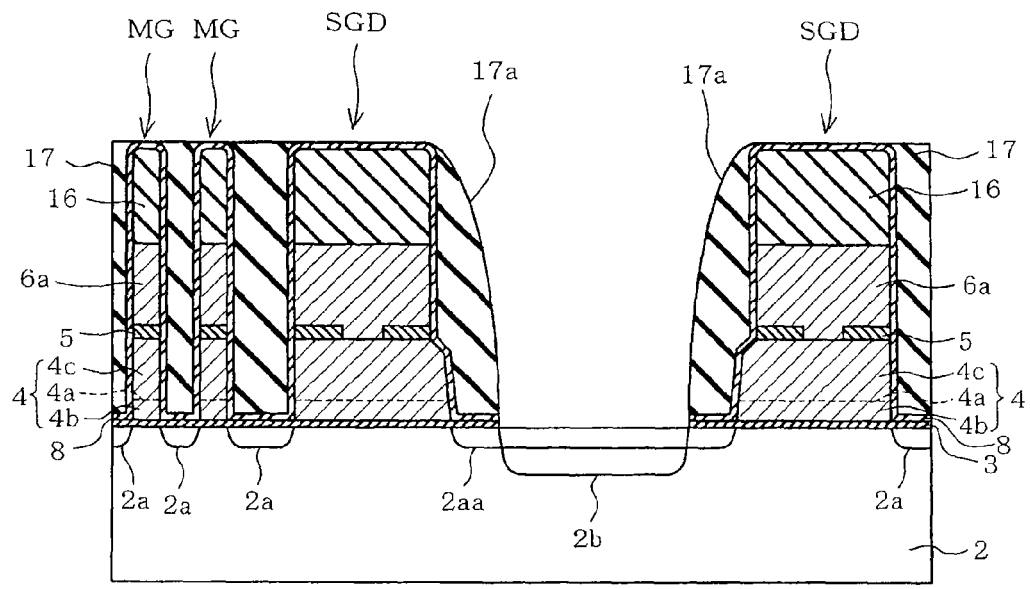
Figure 7B:
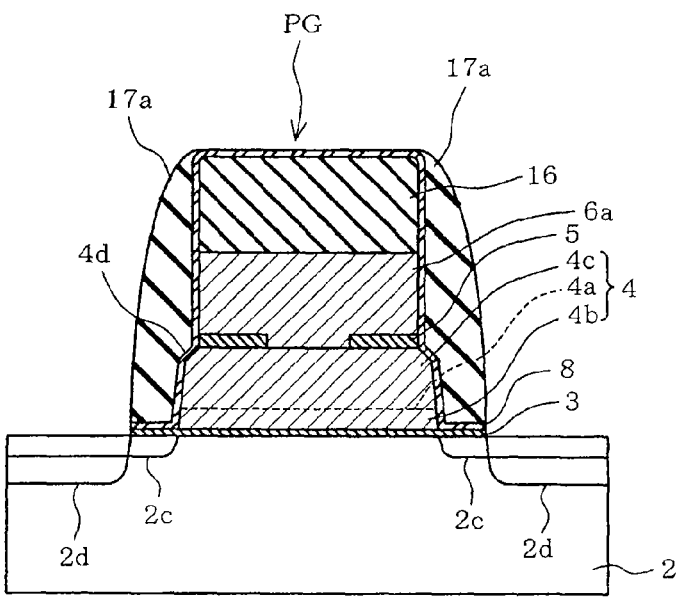

Then, as shown in FIGS. 7A and 7B, silicon nitride film 17 is etched back by RIE until the upper surface of silicon oxide film 8 or nitride cap 16 is exposed, as well as etching away silicon nitride film 17 residing above the surface of silicon substrate 2 located between gate electrodes SGD to expose the upper surface of silicon substrate 2. At this instance, silicon nitride film 17 remains filled between gate electrodes MG and between gate electrodes MG and SGD. Along the opposing sidewalls of adjacent gate electrodes SGD and along the sidewalls gate electrode PG, silicon nitride film 17a remains in a spacer shape such that its width is reduced with elevation.

Then, using the spacer silicon nitride film 17a as a mask, the surface layer of silicon substrate 2 located between gate electrodes SGD and beside gate electrode PG are heavily doped with impurities such as phosphorous or arsenic, in case of n-type impurities, by ion implantation. Then, the implanted impurities are activated by thermal treatment to obtain a drain region 2b or source region 2b for the contact structures as well as source/drain region 2d to obtain an LDD structure.

Figure 8A:
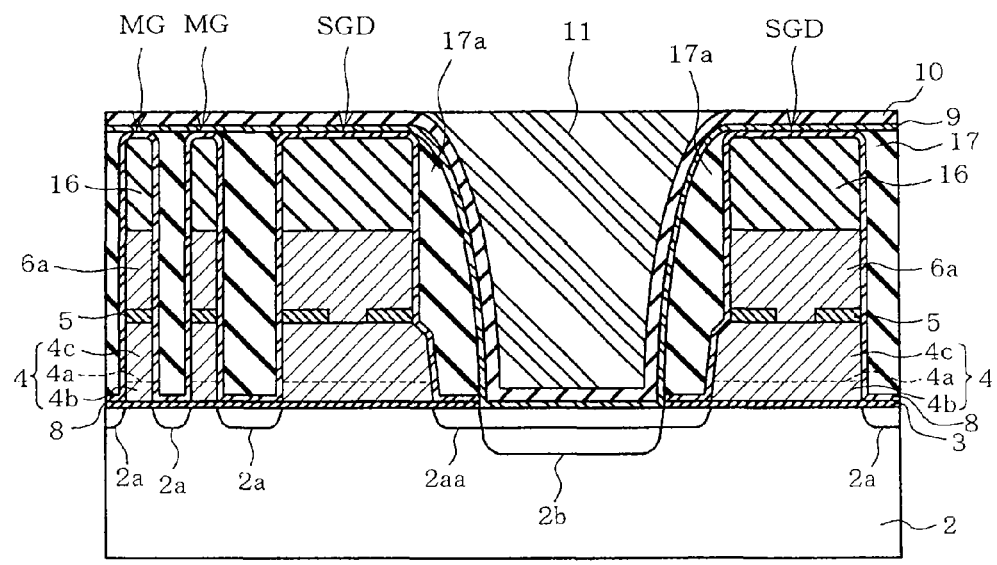
Figure 8B:
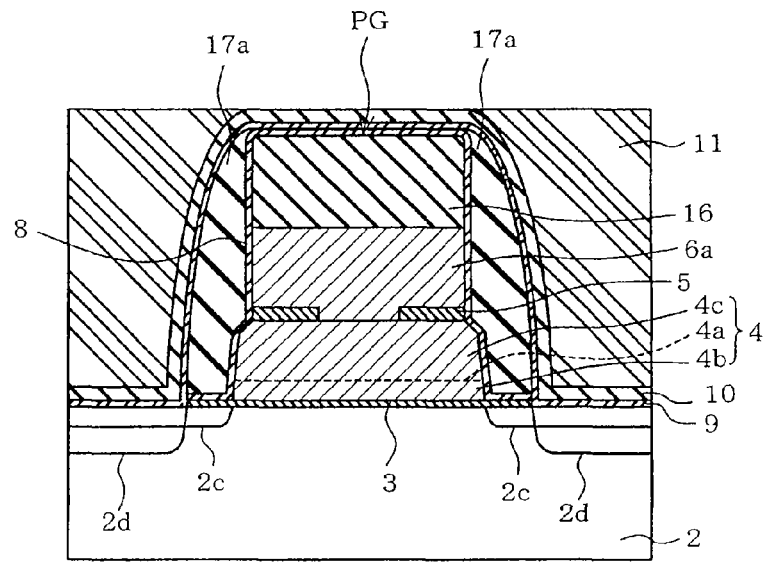

Next, as shown in FIGS. 8A and 8B, silicon oxide film 9 serving as a liner film is blanketed above the underlying structure by CVD. That is, silicon oxide film 9 is lined above the upper surface of silicon nitride film 17 located between gate electrodes MG and between gate electrodes MG and SGD as well as above silicon nitride film 8 or above nitride cap 16 if it was exposed in the preceding RIE. Silicon oxide film 9 is further line along the sidewall of silicon nitride film 17a and the upper surface of silicon substrate 2. Then, above silicon oxide film 9, silicon nitride film 10 serving as a contact stopper is further formed by CVD. Then, NSG film 11 serving as an interlayer insulating film is further formed above silicon nitride film 10 so as to fill the gaps between the select gate electrodes SGD and the recesses located beside gate electrode PG.

The interlayer insulating film, exemplified as NSG film 11 in the first embodiment, is preferably made of materials that allows sacrificial silicon nitride film 17 and silicon nitride film 10 to be etched with relatively higher selectivity. NSG film 11 employed in the first embodiment belongs in the category of a silicon oxide film. Then, using silicon nitride film 10 as a CMP (Chemical Mechanical Polishing) stopper, the upper surface of NSG film 11 is planarized by CMP so that NSG film 11 remains in the region between gate electrodes SGD and in the recesses beside gate electrode PG.

Figure 9A:
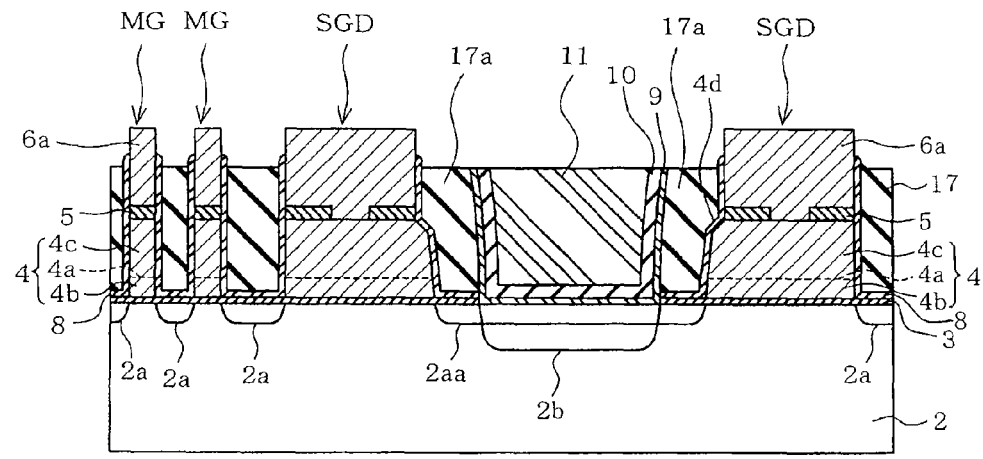
Figure 9B:
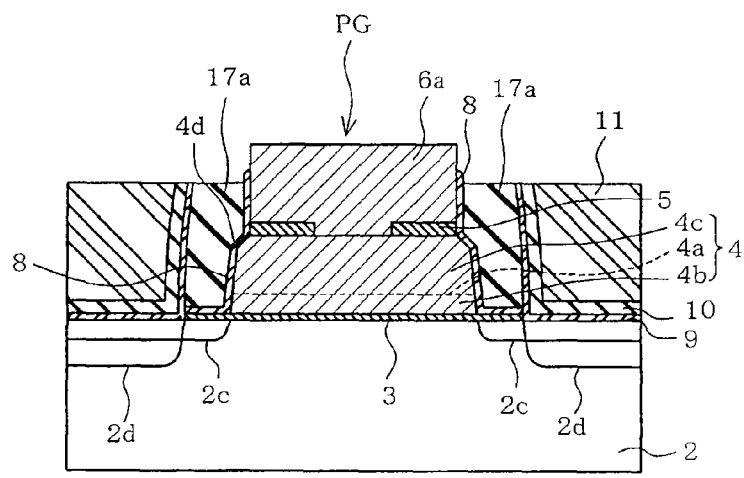

Next, as shown in FIGS. 9A and 9B, nitride cap 16, as well as the upper portions of silicon nitride film 17, silicon nitride film 10, and silicon oxide film 9 are etched back by RIE and removed to expose the upper surface of polycrystalline silicon film 6a. The RIE further etches back NSG 11 such that its upper surface is lowered below the mid height of polycrystalline silicon film 6a and exposes the upper surface and a part of the sidewall of polycrystalline silicon film 6a.

Figure 10A:
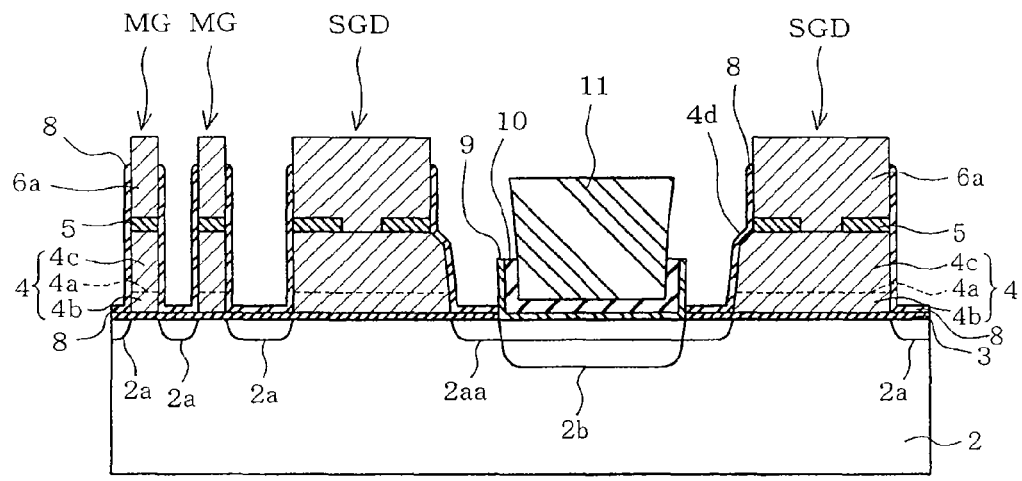
Figure 10B:
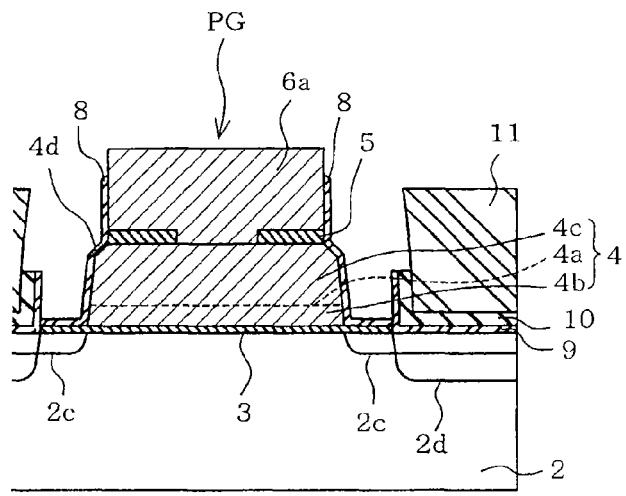

Then, as shown in FIGS. 10A and 10B, silicon nitride films 17, 17a, and 10 are wet etched by an etchant such as hot phosphoric acid ($H_3PO_4$) that allows silicon nitride films to be etched with higher selectivity relative to silicon oxide films, thereby completely removing sacrificial silicon nitride films 17 and 17a and partially removing silicon nitride film 10 located along the sidewall of NSG film 11.

Figure 11A:
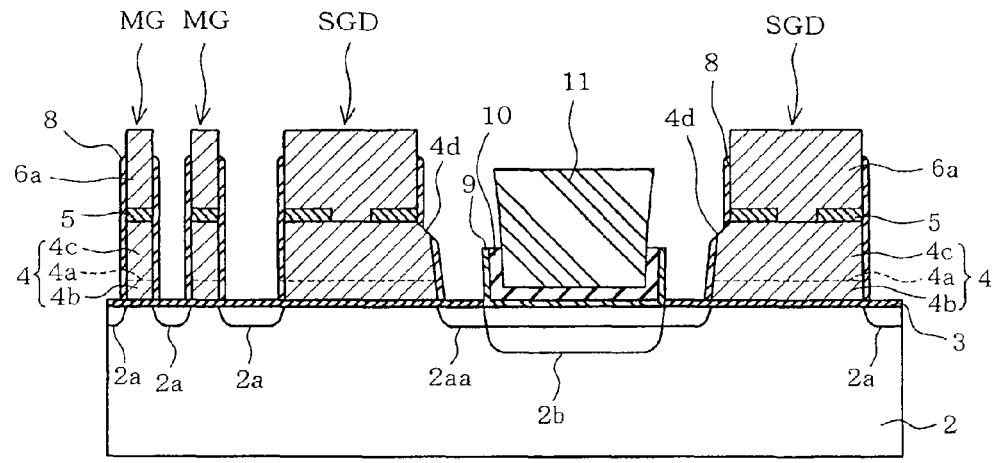
Figure 11B:
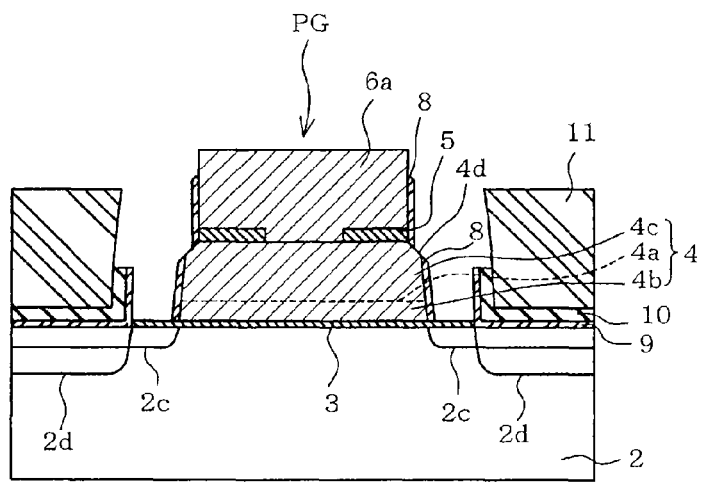

Next, as can be seen in FIGS. 11A and 11B, a dry pretreatment is carried out prior to the formation of metal for silicidation. More specifically, a low power RIE which is just enough to remove the native oxide film remaining on the surface of polycrystalline silicon film 6 is carried out. As etching progresses anisotropically, features that are close to being vertical against the upper surface of silicon substrate 2 are difficult to etch, but the features that are not steeply angled are easily etched. Thus, silicon oxide film 8 located above the upper surface of silicon substrate 2 and along slope 4d of polycrystalline silicon film 4 extending along the sidewall of gate electrode SGD is easily removed. Silicon oxide film 8 is easily moved especially in the portion located above the gradual upper side section of slope 4d.

Figure 12A:
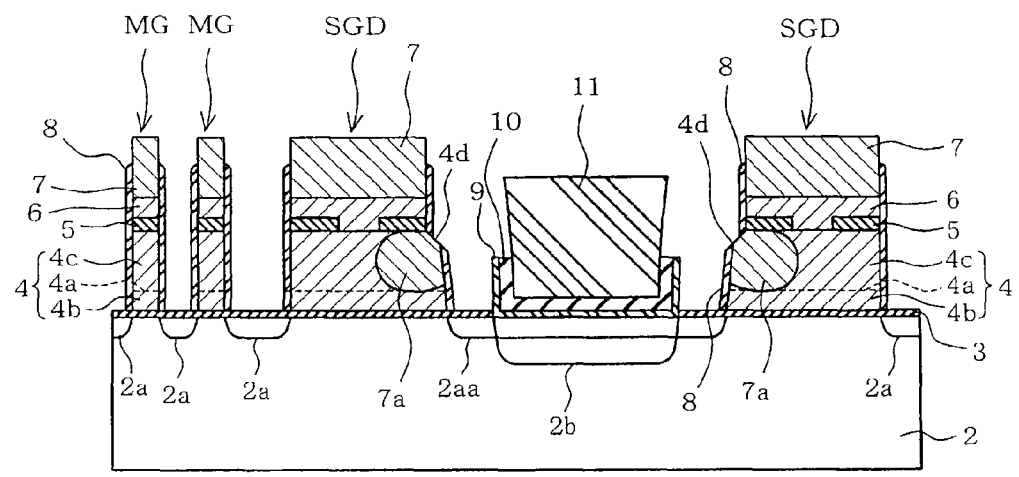
Figure 12B:
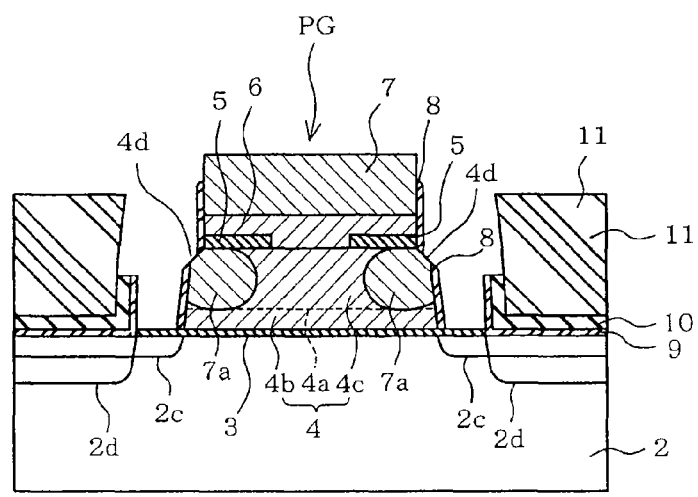

Then, as shown in FIGS. 12A and 12B, nickel (Ni) employed as the metal for silicidation is sputtered entirely over the underlying structure, which is followed by a thermal treatment, to silicide the nickel film placed in contact with polycrystalline silicon films 6a and 4c. In this case, the nickel film is placed in contact with polycrystalline silicon film 6a and upper polycrystalline silicon layer 4c at slope 4d and thus, silicidation progresses from there. As a result, upper portion of polycrystalline silicon film 6a is turned into silicide portion 7 and upper polycrystalline silicon layer 4c partially turned into silicide portion 7a. As for silicide portion 7a, the silicidation progresses from slope 4d but is stopped at isolation layer 4a and thus, silicide portion 7a stays within the bounds of upper polycrystalline silicon layer 4c and does not encroach into lower polycrystalline silicon layer 4b.

Thereafter, non-reactive metal remaining on the feature is removed by a mixture of sulfuric acid and hydrogen peroxide. Then, silicide portions 7 and 7a are stabilized through RTA (Rapid Thermal Anneal).

Figure 13A:
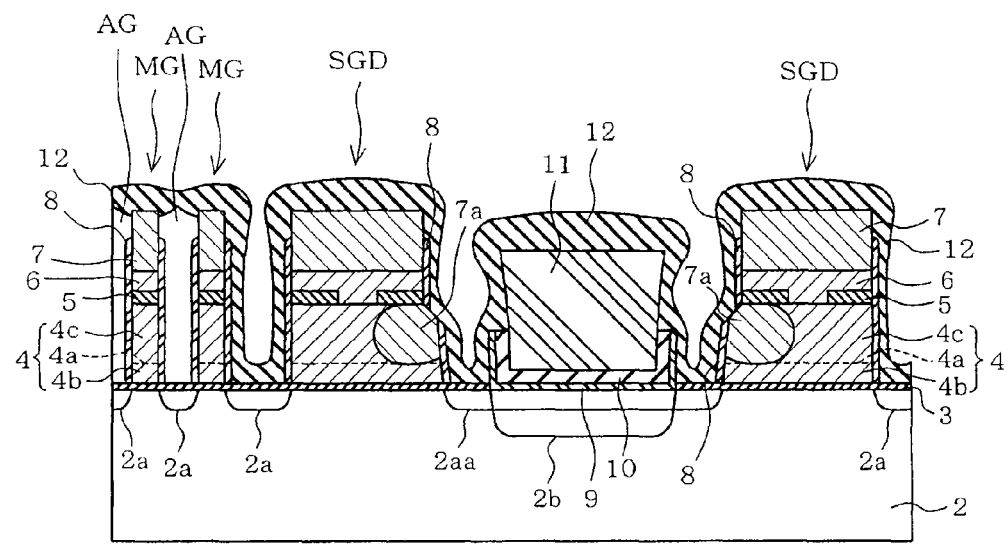
Figure 13B:
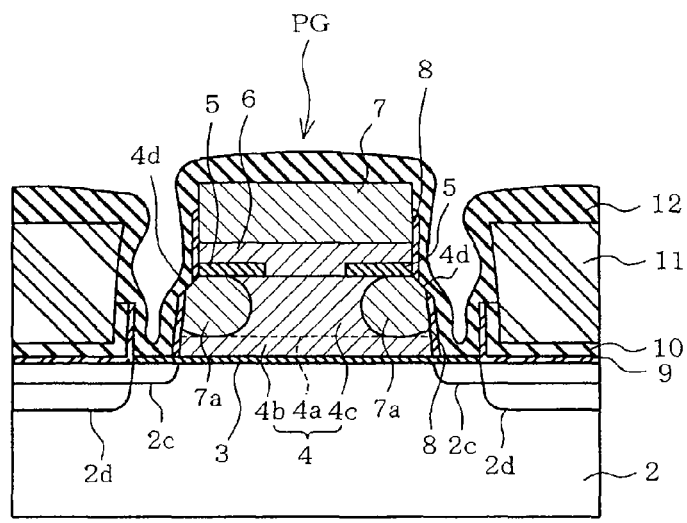

Next, as shown in FIGS. 13A and 13B, silicon oxide film 12 is deposited by plasma CVD employing a recipe providing relatively poor gap fill capability such that substantially no silicon oxide film 12 forms in the dense regions within the narrow gaps between gate electrodes MG but instead forms so as to bridge the upper surfaces of gate electrodes MG, whereas in the sparse regions, silicon oxide film 12 forms along the exposed surfaces. Thus, gaps between gate electrodes MG remains substantially empty and enclosed by silicon oxide film 12 to define air gaps AG serving as an insulator provided so as to isolate gate electrodes MG.

Figure 14A:
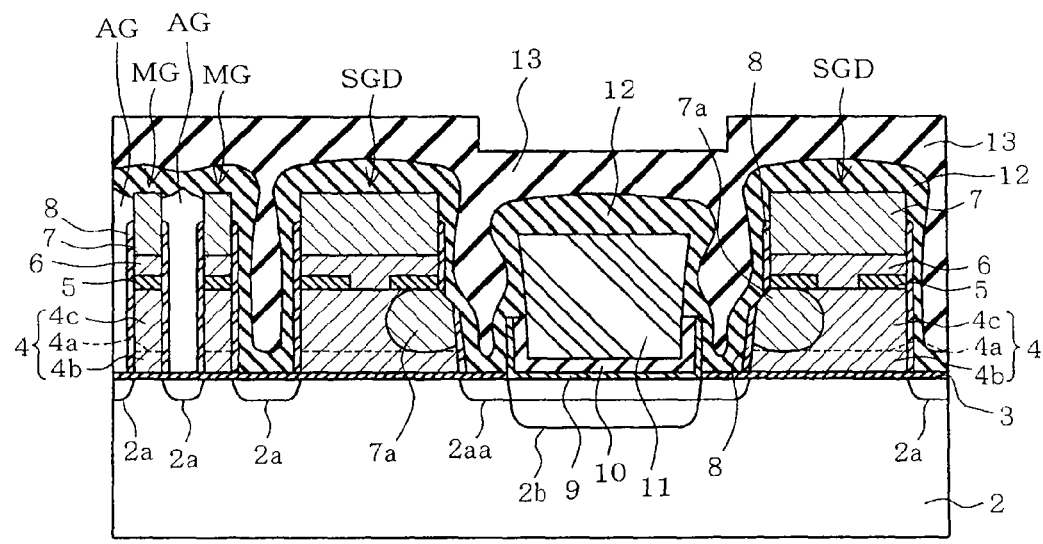
Figure 14B:
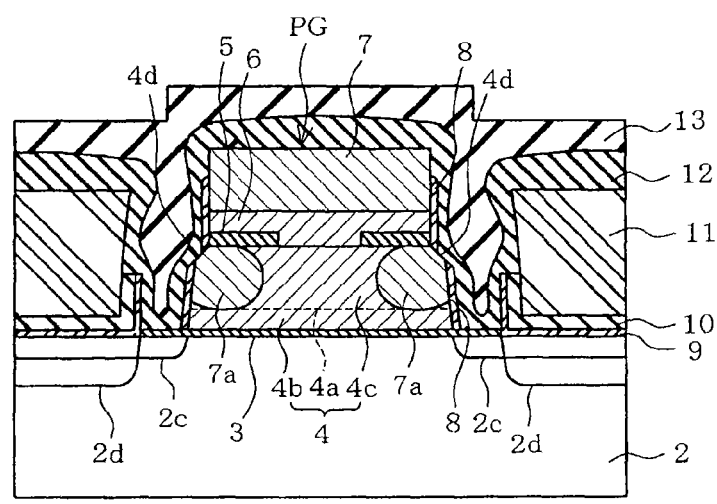

Next, as shown in FIGS. 14A and 14B, silicon oxide film 13 serving as a fill material is formed above silicon oxide film 12 by ALD or LP-CVD carried out at a temperature level ranging between room temperature and several hundred degrees Celsius. Formation of silicon oxide film 13 carried out by the above described recipe provides relatively better gap filling capability as compared to silicon oxide film 12 and thereby fills the gaps between gate electrodes SGD and MG. Between gate electrodes SGD, silicon oxide film 13 fills the gap between select gate SGD and the upper sidewall of NSG film 11. In the Y-directional sides of gate electrode PG, silicon oxide film 13 is filled between gate electrode PG and the upper sidewall of NSG film 11.

Figure 15A:
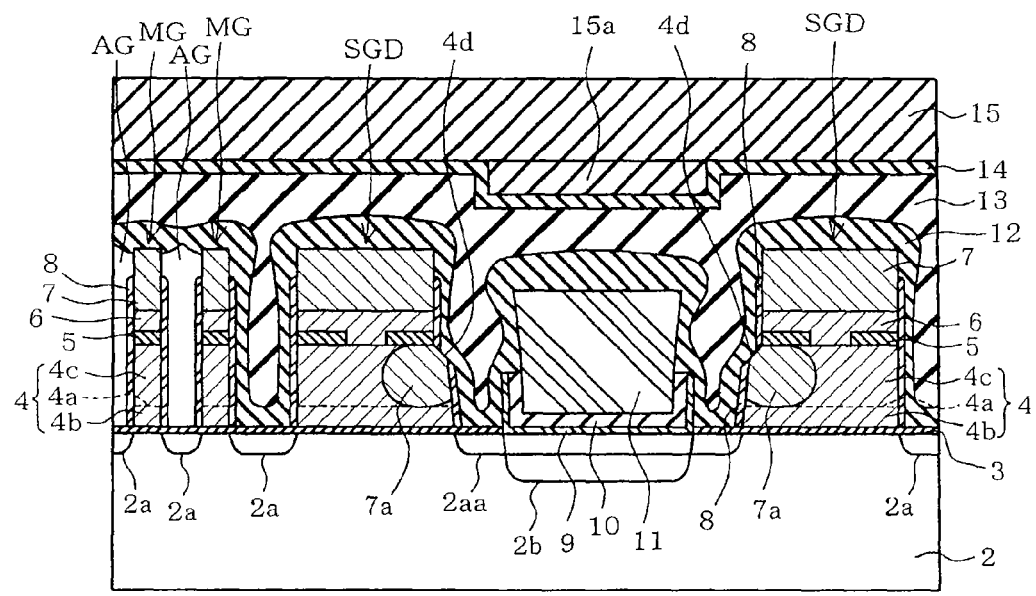
Figure 15B:
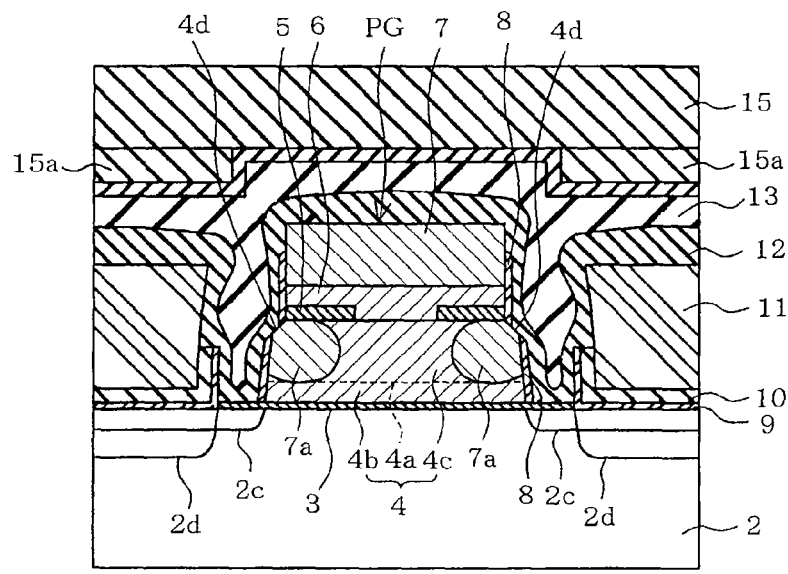

Then, as shown in FIGS. 15A and 15B, silicon nitride film 14 serving as a CMP stopper is formed above silicon oxide film 13 by LP-CVD. Then, silicon oxide film 15 serving as an interlayer insulating film is formed above silicon nitride film 14 by LPCVD and is thereafter planarized using silicon nitride film 14 as a CMP stopper to obtain silicon oxide film 15a filled in the recess defined by silicon nitride film 14. Thereafter, silicon oxide film 15 is further redeposited in a predetermined thickness to form an interlayer insulating film. Silicon oxide film 15 serving as the interlayer insulating film need not be formed in two steps as described above. In an alternative embodiment, silicon nitride film 14 need not be used as a stopper film, in which case, CMP may be controlled so as to be stopped above silicon nitride film 14 to thereby leave sufficient amount of silicon oxide film 15 remaining above silicon nitride film 14 such that additional silicon oxide film 15 need not be redeposited.

Figure 16A:
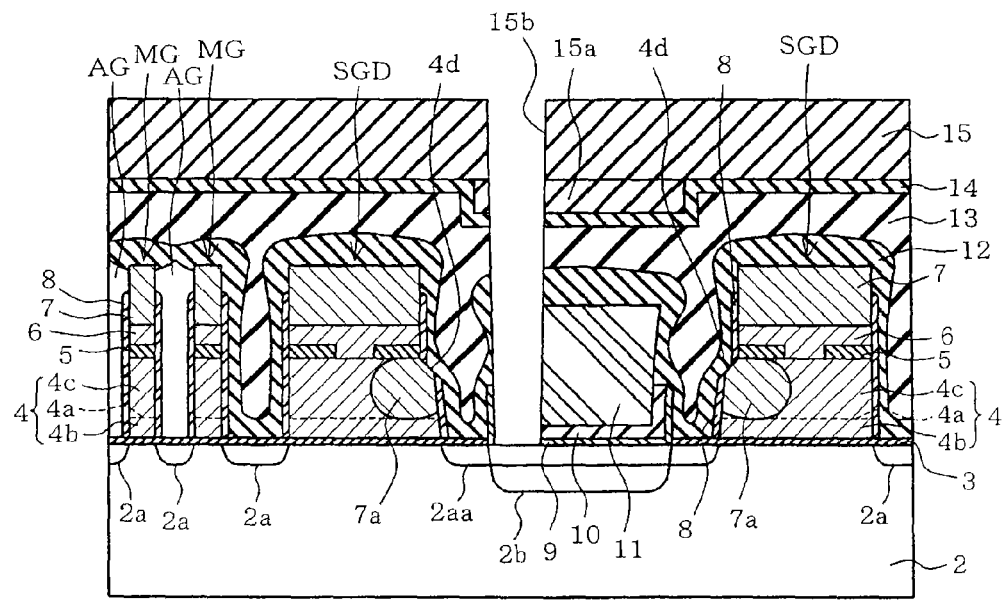
Figure 16B:
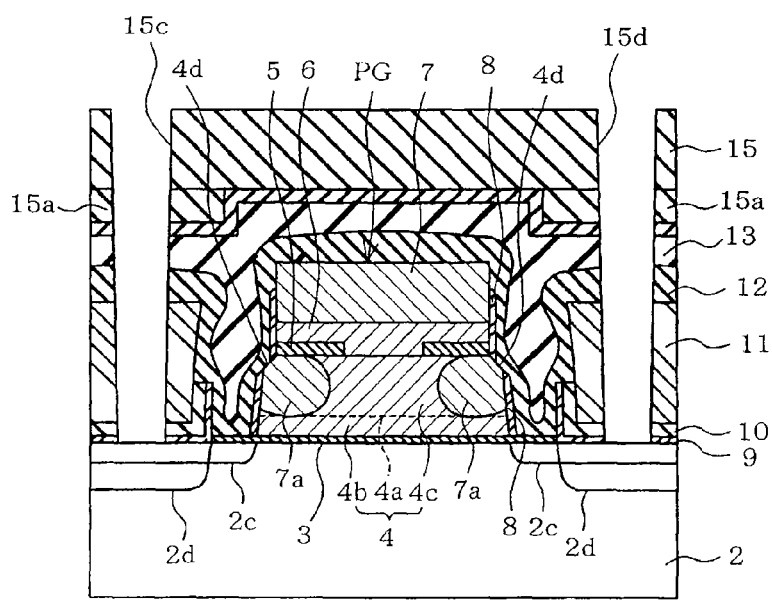

Next, as shown in FIGS. 16A and 16B, contact holes 15a, 15b, and 15c are formed by photolithography for forming bit line contacts CBa and CBb of the memory cell region and source contact Cps and drain contact Cpd of the peripheral circuit region. Contact hole 15a is shown to be used for formation of bit line contact CBb. When forming contact holes 15a, 15b, and 15c, silicon oxide film 15, silicon nitride film 14, silicon oxide film 13, silicon oxide film 12, and NSG film 11 are etched one after another until reaching silicon nitride film 10 serving as a contact stopper where etching is tentatively stopped for adjustment in case of over or under etching. Thereafter, silicon nitride film 10 and silicon oxide film 9 are successively etched away to form contact holes 15a to 15c.

Next, referring back to FIGS. 3A and 3B, a thin barrier metal not shown made of materials such as titanium is lined along the inner surface of contact holes 15a to 15c, whereafter contact plugs such as tungsten (W) for forming bit line contacts CBa and CBb as well as source line contact Cps and drain contact Cpd are filled in contact holes 15a to 15c. The structures illustrated in FIGS. 3A and 3B are thus, obtained. Thereafter, multilevel interconnect structure is formed above the shown structure, the process flow of which will not be described, since they are irrelevant to the features of the first embodiment. The above described process flow is one example for obtaining NAND flash memory 1.

In the first embodiment, silicide portion 7a is formed in lower electrodes of select gate electrodes SGD of select transistors Trs1 and Trs2 as well as gate electrodes PG of peripheral circuit transistors Trp while providing air gap AG as an insulator between gate electrodes MG of memory cell transistors Trm. Thus, resistance of gate electrodes SGD and PG can be reduced.

Slope 4d taking a stepped structure is formed during the formation of the gate structures of gate electrodes SGD and PG. Thus, when forming silicide portion 7a in lower electrode of gate electrodes SGD of select transistors Trs1 and Trs2 and gate electrodes PG of peripheral transistors Trp, silicon oxide film 8 formed along slope 4d is easily etched and therefore made relatively thinner or removed to facilitate the reaction of nickel and upper polycrystalline silicon layer 4c during silicidation as compared to other portions. Thus, when forming silicide portion 7 in polycrystalline silicon film 6a, silicide portion 7a can be formed within upper polycrystalline silicon layer 4c at the same time.

Polycrystalline silicon film 4 is subdivided into lower polycrystalline silicon layer 4b and upper polycrystalline silicon layer 4c by providing isolation layer 4a. Thus, silicidation can be stopped at isolation layer 4a so that silicide portion 7a stays within the bounds of upper polycrystalline silicon layer 4c and does not encroach into gate insulating film 3. The above described configuration allows controlled silicidation and thereby prevents silicide portion 7a form contacting gate insulating film 3, which in turn reduces the resistance without varying the threshold voltage of select transistors Trs1 and Trs 2 as well as peripheral circuit transistors Trp.

Air gap Ag provided between gate electrodes MG of memory cell transistors Trm reduces the floating capacitance between memory cell transistors Trm to suppress problems such as capacitance coupling between the elements which in turn contributes in sustaining outstanding isolation between the elements.

FIG. 17 illustrates a second embodiment and the differences from the first embodiment will be described hereinafter.

In the second embodiment, polycrystalline silicon film 4 is formed as a single continuous layer of film free of insulation layer 4a. As the process flow described in the first embodiment progresses, slope 4d taking a stepped structure is formed in polycrystalline silicon film 4 during the formation of gate structures shown in FIGS. 3A and 3B. Silicon oxide film 8 formed along the upper portion of slope 4d gets thinned or removed just before the silicidation described in FIGS. 11A and 11B to facilitate the silicidation.

Figure 17A:
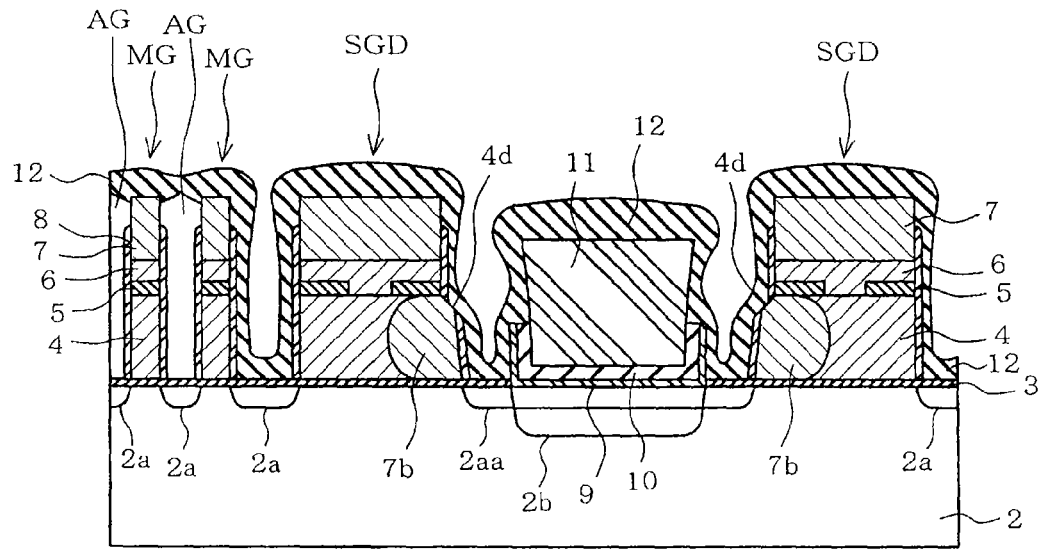
FIG. 17A is a schematic vertical cross sectional view taken along line 3A-3A of FIG. 2A and depicts one phase of the manufacturing process flow of a second embodiment.
Figure 17B:
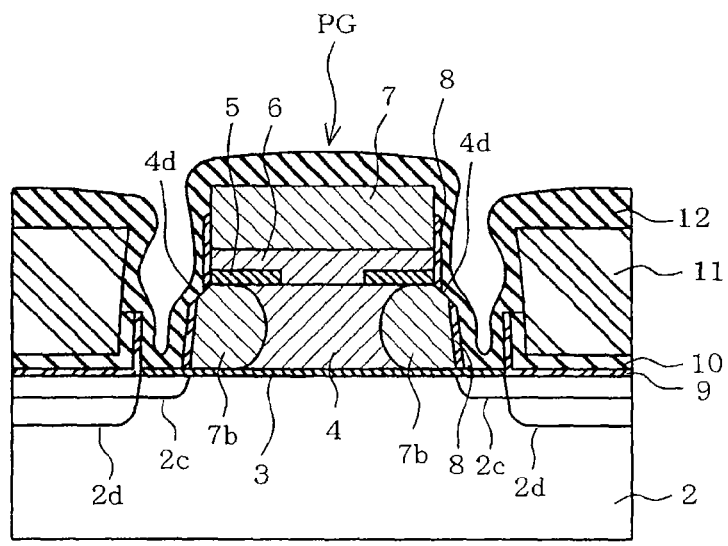
FIG. 17B is a schematic vertical cross sectional view taken along line 3B-3B of FIG. 2B and depicts one phase of the manufacturing process flow of a second embodiment.

As a result, the absence of a restraint to suppress the silicidation shown in FIGS. 12A and 12B allows the silicidation to reach gate insulating film 3. Thus, as can be seen in FIGS. 17A and 17B, silicide portion 7b within polycrystalline silicon film 4 is extended to contact gate insulating film 3.

Nickel silicide has a work function that is approximately 0.3V greater than the work function of polycrystalline silicon. As a result, when silicide portion 7b including nickel silicide is placed in contact with gate insulating film 3, the MOS structure configured by nickel silicide, gate insulating film 3, and silicon substrate 2 exhibits a relaxed bend in the band.

Thus, in a peripheral circuit transistor Trp, threshold voltage is increased by approximately 0.3V to advantageously suppress hot carriers at the edge of peripheral circuit transistor Trp. Similarly, in a select transistor, formation of silicide portion 7b increases the threshold voltage at the edge of the select gate electrode opposing the contact region to allow the dose of ion implantation into the channel region to be reduced. As a result, increase in the resistance of silicon substrate 2 located in the region where bit line contacts CBa and CBb are formed can be inhibited to improve the electrical properties of the device.

The above described embodiments may be modified or expanded as follows.

The first and the second embodiments exemplified polycrystalline silicon film 4 as the first film and polycrystalline silicon film 6 as the second film. Instead of forming a polycrystalline silicon film, amorphous silicon film may be formed instead. However the amorphous silicon film will most likely be converted to polycrystalline silicon film towards the end of the process flow.

Bit line contacts CBa and CBb are disposed relatively proximal to either of the opposing select gate electrodes SGD in an alternate arrangement and thus, is in a zigzag layout as can be seen in FIG. 2A. Alternatively, a single bit line contact CBa or CBb may be disposed alternately in the Y-directional center of each element region Sa.

The first and the second embodiments were directed to bit line contact CBa and CBb, but an alternative embodiment may be directed to a source line contact.

NSG film 11 may be replaced by films such as BPSG (Boro Phospho Silicate Glass) and PSG (Phospho Silicate Glass) films.

A dummy transistor may be provided between select transistor Trs1/Trs2 and memory cell transistor Trm as required.

The above described embodiments were directed to NAND flash memory 1, however, other embodiments may be directed to other nonvolatile semiconductor storage devices such as NOR flash memory and EERROM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage device, comprising:
 a semiconductor substrate including a first region and a second region;
 a gate insulating film formed in the first region and the second region;
 a first transistor formed above the gate insulating film in the first region and comprising a first gate electrode including a charge storage layer, an interelectrode insulating film, and a control electrode layer, the first gate electrode being isolated from one another;
 a second transistor formed above the gate insulating film in the first region so as to be located adjacent to the first transistor, the second transistor comprising a second gate electrode including a lower electrode, an upper electrode, and an upper silicide portion above the upper electrode; and
 a third transistor formed above the gate insulating film in the second region and comprising a third gate electrode including a lower electrode, an upper electrode, and an upper silicide portion above the upper electrode;
 wherein the lower electrodes of the second and the third gate electrodes have a first side and a second side taken along a length direction of the second and the third gate electrodes, the lower electrodes of the second and the third gate electrodes including a lower silicide portion in which at least the first side of the lower electrodes are partially silicided.

2. The device according to claim 1, wherein the lower silicide portions of the second and the third gate electrodes are located in an upper portion of the lower electrode and above the gate insulating film.

3. The device according to claim 2, wherein the lower electrodes of the second and the third gate electrodes include an isolation layer below the silicide portion, the isolation layer configured to stop further silicidation.

4. The device according to claim 1, wherein the lower electrodes of the of the second and the third gate electrodes include a stack of lower polycrystalline layer, an isolation layer comprising a thin oxide film, and an upper polycrystalline silicon layer, and wherein the lower silicide portion resides within the lower polycrystalline silicon layer.

5. The device of claim 1, wherein the lower silicide portions of the second and the third gate electrodes at least partially contact the gate insulating film.

6. The device according to claim 5, wherein the lower silicide portions of the second and the third gate electrodes occupy half or less than half of widths of the lower electrodes of the second and the third gate electrodes.

7. The device of claim 1, wherein the first transistor comprises a memory cell transistor, the second transistor comprises a select transistor, and the third transistor comprises a peripheral circuit transistor.

8. The device according to claim 1, wherein at least the first sides of the lower electrodes of the second and the third gate electrodes include a stepped section having a larger width compared to widths of the interelectrode insulating film and the upper electrode located above the lower electrode.

9. The device according to claim 1, wherein the first side of the lower electrode of the second gate electrode opposes the first side of the lower electrode of the adjacent second gate electrode, and wherein the lower silicide portion is located in the first side of the lower electrode of the second gate electrode.

10. The device according to claim 1, wherein the upper and the lower silicide portions comprise a silicide which is selected from a group consisting of nickel silicide, cobalt silicide, titanium silicide, platinum silicide, palladium silicide, tantalum silicide, and molybdenum silicide.

11. A method of manufacturing a nonvolatile semiconductor storage device, comprising:
   forming a gate insulating film above a semiconductor substrate;
   forming, above the gate insulating film, a first film comprising a polycrystalline silicon film or an amorphous silicon film, an interelectrode insulating film, and a second film comprising a polycrystalline silicon film or an amorphous silicon film;
   patterning the second film, the interelectrode insulating film, and the first film into:
      a plurality of first gate electrodes of a memory cell transistor,
      a plurality of second gate electrodes, having a first side and a second side, of a select transistor, the first side of the second gate electrode opposing the first side of the adjacent second gate electrode, and
      a plurality of third gate electrodes, having a first side and a second side, of a peripheral circuit transistor,
   so that the first side of the first film of the second gate electrode as well as the first and the second sides of the first film of the third gate electrode include a stepped portion that protrudes with respect to the second film;
   forming an oxide film above the first, second, and the third gate electrodes;
   exposing an upper portion of the second film and a portion of the stepped portion of the first film;
   forming a lower silicide portion by siliciding the stepped portion of the first film as well as forming an upper silicide portion by siliciding the upper portion of the second film; and
   forming, after the silicidation, an insulating film across the upper surfaces of isolated structures of the first gate electrodes.

12. The method according to claim 11, wherein forming the first film includes forming an isolation layer for stopping further silicidation.

13. The method according to claim 12, wherein forming the isolation layer includes forming a thin silicon oxide film.

14. The method according to claim 11, wherein forming the first film includes forming a lower polycrystalline silicon layer, an isolation layer comprising a thin oxide film, and an upper polycrystalline silicon layer.

15. The method according to claim 14, wherein the isolation layer is formed by purging oxygen after the formation of the lower polycrystalline silicon layer, and is followed by the formation of the upper polycrystalline silicon layer, and wherein forming the lower silicide portion includes siliciding the upper polycrystalline silicon layer and stopping the silicidation at the isolation layer.

16. The method according to claim 11, wherein the formed lower silicide portion at least partially contacts the gate insulating film.

17. The method according to claim 11, wherein the upper and the lower silicide portions comprise a silicide which is selected from a group consisting of nickel silicide, cobalt silicide, titanium silicide, platinum silicide, palladium silicide, tantalum silicide, and molybdenum silicide.

18. The method according to claim 11, wherein forming the oxide film is followed by filling gaps between the first gate electrodes by a sacrificial film and forming a spacer along the first sides of the opposing second gate electrodes with the sacrificial film, forming a heavily doped diffusion region in a surface layer of a semiconductor substrate located between the opposing second gate electrodes using the spacer as a mask, and removing the sacrificial film, whereafter an upper portion of the second film and a portion of the stepped portion of the first film are exposed.

19. The method according to claim 18, wherein the sacrificial film comprises a silicon nitride film.

20. The method according to claim 11, wherein the insulating film formed across the upper surfaces of the isolated structures of the first gate electrodes comprises a silicon oxide film.

* * * * *